United States Patent
Honda et al.

(10) Patent No.: US 10,076,051 B2
(45) Date of Patent: Sep. 11, 2018

(54) STRUCTURE FOR FIXING PRINTED BOARD IN ELECTRONIC DEVICE UNIT

(71) Applicant: FANUC Corporation, Minamitsuru-gun, Yamanashi (JP)

(72) Inventors: Yuuichi Honda, Minamitsuru-gun (JP); Kazuyuki Sasaki, Minamitsuru-gun (JP); Hitoshi Watanabe, Minamitsuru-gun (JP)

(73) Assignee: FANUC Corporation, Minamitsuru-gun, Yamanashi (JP)

( * ) Notice: Subject to any disclaimer, the term of this patent is extended or adjusted under 35 U.S.C. 154(b) by 118 days.

(21) Appl. No.: 15/001,388

(22) Filed: Jan. 20, 2016

(65) Prior Publication Data
US 2016/0219746 A1    Jul. 28, 2016

(30) Foreign Application Priority Data
Jan. 26, 2015 (JP) .................................. 2015-012734

(51) Int. Cl.
*H05K 7/00* (2006.01)
*H05K 7/14* (2006.01)

(52) U.S. Cl.
CPC ......... *H05K 7/1417* (2013.01); *H05K 7/1418* (2013.01)

(58) Field of Classification Search
None
See application file for complete search history.

(56) References Cited

U.S. PATENT DOCUMENTS 5,155,663 A * 10/1992 Harase ............ G06K 19/07732
                                                 273/148 B
5,434,752 A *  7/1995 Huth ...................... H01R 27/00
                                                 361/212
6,005,775 A * 12/1999 Chiu ....................... H05K 7/142
                                                 361/736

(Continued)

FOREIGN PATENT DOCUMENTS

JP   S58-170891 U   11/1983
JP   S63-55484 U    4/1988

(Continued)

OTHER PUBLICATIONS

Notification of Reasons for Refusal dated Nov. 22, 2016 in Japanese Patent Application No. 2015-012734 (4 pages) with an English Translation (3 pages).

*Primary Examiner* — Courtney Smith
*Assistant Examiner* — Rashen E Morrison
(74) *Attorney, Agent, or Firm* — Drinker Biddle & Reath LLP

(57) ABSTRACT

An electronic device unit includes a printed board housing body, a printed board, and a front face panel to which the printed board is fixed. The front face panel is provided with hooks each having a tip provided with a recessed part and knobs for disengaging the hooks. The printed board housing body includes engagement parts each provided with a protruding part to fit with the recessed part of each hook. Pinching the knobs for removing the front face panel from the printed board housing body causes the hooks turn in directions such that engagement between the hooks and the engagement parts and fitting between the recessed parts and the protruding parts are released.

9 Claims, 4 Drawing Sheets

(56) References Cited

U.S. PATENT DOCUMENTS

| | | | |
|---|---|---|---|
| 6,836,411 B2* | 12/2004 | Slowig | H05K 5/0017 200/296 |
| 2010/0187957 A1* | 7/2010 | Liang | G06F 1/187 312/223.2 |
| 2016/0219746 A1* | 7/2016 | Honda | H05K 7/1417 |

FOREIGN PATENT DOCUMENTS

| | | |
|---|---|---|
| JP | S63-98693 U | 6/1988 |
| JP | H01-73984 U | 5/1989 |
| JP | H03-66197 A | 3/1991 |
| JP | S03-53888 U | 5/1991 |
| JP | H05-48274 A | 2/1993 |
| JP | H08-18257 A | 1/1996 |
| JP | 2001-111264 A | 4/2001 |

* cited by examiner

STRUCTURE FOR FIXING PRINTED BOARD IN ELECTRONIC DEVICE UNIT

BACKGROUND OF THE INVENTION

1. Field of the Invention

The present invention relates to a structure for fixing a printed board in an electronic device unit and particularly to a structure for fixing a printed board in an electronic device unit in which improvement in tolerance in a direction of impact is designed so that the printed board may not easily slip off when the impact is exerted in a direction of removal of the printed board.

2. Description of the Related Art

As illustrated in FIG. 1, an electronic device unit is composed of a printed board housing body 2, a printed board 11, and a front face panel 3 to which the printed board 1 is fixed. In the printed board housing body 2, a front face thereof has an opening into which the front face panel 3 having the printed board 1 fixed thereon may be attached and fixed, a guide rail 2a for guiding the printed board 1 is provided on each of top and bottom faces, and a rear face is closed by a wall surface 2b. On the wall surface 2b on the rear face, a connector 2c may be provided that is to be connected to printed board circuits through a connector 1a, provided on the printed board 1, upon insertion of the printed board 1. In FIG. 1, an arrow C designates a direction in which the printed board 1 is pulled out of the printed board housing body 2 (direction in which the guide rails 2a extend).

FIG. 2 is a sectional view (of sections taken along line A-A illustrated in FIG. 1) of the printed board 1, the printed board housing body 2, and the front face panel 3 in a state in which the printed board 1 fixed to the front face panel 3 is housed in the printed board housing body 2 and an arrow C therein designates the direction in which the printed board 1 is pulled out of the printed board housing body 2 as in FIG. 1.

The front face panel 3 has hooks 3a on upper and lower parts thereof so as to engage with engagement parts 2d of the printed board housing body 2 (FIG. 2 illustrates only the upper hook 3a). As disclosed in Japanese Utility Model Application Laid-Open No. 03-053888, a structure for fixation between the front face panel 3 and the printed board housing body 2 is composed of the hooks 3a provided on the front face panel 3 and hook receivers (the engagement parts 2d) of the printed board housing body 2. Knobs 3b are provided on the front face panel 3. Pinching of each knob 3b by fingers from upper and lower sides (action in directions illustrated by arrows A) makes the hook 3a move in a direction of an arrow B and disengage from the engagement part 2d of the printed board housing body 2, so that the printed board 1 can be removed from the printed board housing body 2.

Providing a recessed part at a tip of a hook and engaging the recesses part with a raised part (protruding part) of solder on a printed board are disclosed in Japanese Utility Model Application Laid-Open Nos. 63-055484 and 63-098693.

In the structure disclosed in Japanese Utility Model Application Laid-Open No. 03-053888, in which forces arising from impact in the direction (direction of an arrow C in FIG. 3) of removal of the printed board 1 during transportation, for instance, as illustrated in FIG. 3, are received by the hooks 3a on the front face panel 3 that are in elastic engagement with the engagement parts 2d of the printed board housing body 2, however, there is fear that the impact of great magnitude might cause the hooks 3a to slide, since frictional forces caused by the elastic engagement could not withstand such an impact, with the result that the printed board 1 fixed to the front face panel 3 might come off (the engagement parts 2d of) the printed board housing body 2.

In above-mentioned techniques disclosed in Japanese Utility Model Application Laid-Open Nos. 63-055484 and 63-098693, in which the engagement between the recessed part provided at the tip of the hook and the protruding part formed of a solder part prevents the printed board from easily coming off, there is a problem in that it is hard to disengage the hook in maintenance or the like because no special structure for removal of the printed board is provided.

SUMMARY OF THE INVENTION

An object of the present invention is to provide a structure for fixing a printed board in an electronic device unit in which the printed board may not easily slip off when impact is exerted in a direction of removal of the printed board and may easily be removed in maintenance or the like.

In the structure for fixing the printed board in the electronic device unit according to the present invention, the electronic device unit includes a printed board housing body, a printed board, and a front face panel to which the printed board is fixed. The front face panel includes hooks on which first recessed parts or first protruding parts are provided at the tip of each of the hooks, and knobs for disengaging the hooks. The printed board housing body includes engagement parts that engage with the hooks when the front face panel to which the printed board is fixed is attached thereto, each of the engagement parts being provided with a second protruding part to be fitted into the first recessed part or a second recessed part into which the first protruding part is fitted. And the printed board housing body and the front face panel are configured so that pinching the knobs for removing the front face panel from the printed board housing body causes the hooks turn in directions such that engagement between the hooks and the engagement parts and fitting between the first recessed parts and the second protruding part or between the first protruding parts and the second recessed parts are released.

Each of the knobs may include a center part that is located at general center thereof and that is configured so as to have a bending elastic modulus lower than the other parts of the knob have.

Each of the knobs may be formed V-shaped by bending work at a bending fulcrum located at general center of the knob so that each of the V-shaped knobs has a portion that extends from the bending fulcrum to the hook at an angle with respect to the direction perpendicular to a panel surface of the front face panel.

Impact buffering hooks may be provided on top and bottom faces or a rear face of the printed board housing body and third recessed parts or third protruding parts may be provided on the printed board so that the impact buffering hooks are engaged with the third recessed parts or the third protruding parts when the printed board is housed in the printed board housing body.

An impact buffering hook may be provided on a rear face of the printed board housing body and a hook receiving part may be provided on the printed board so that the impact buffering hook fits with the hook receiving part when the printed board is housed in the printed board housing body.

The present invention thus provides the structure for fixing the printed board in the electronic device unit in which the printed board may not easily slip off when impact is exerted in the direction of removal of the printed board and may easily be removed in maintenance or the like.

BRIEF DESCRIPTION OF THE DRAWINGS

The above-mentioned and other objects and features of this invention will become apparent from the following description of embodiments with reference to the accompanying drawings, in which.

DETAILED DESCRIPTION OF THE PREFERRED EMBODIMENTS

Figure 1:
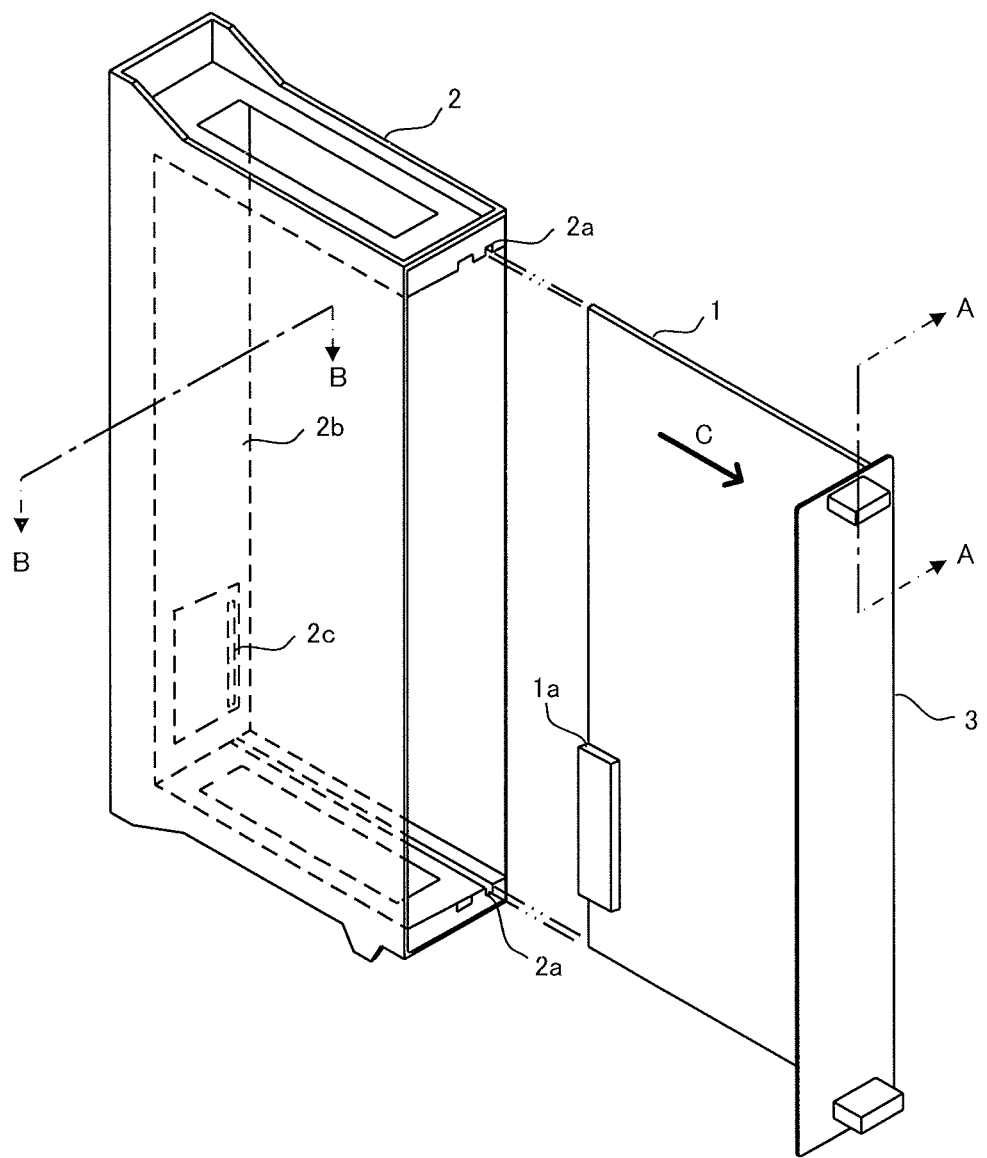
FIG. 1 is a diagram for explaining that an electronic device unit includes a printed board housing body, a printed board, and a front face panel.
Figure 2:
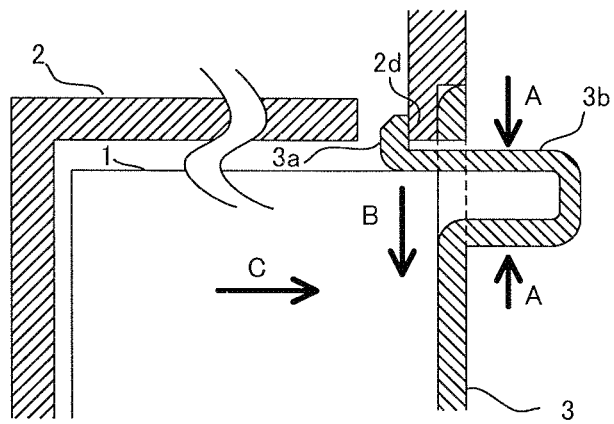
FIG. 2 is a sectional view, taken along a broken line A illustrated in FIG. 1, of the printed board, the printed board housing body, and the front face panel in a state in which the printed board is housed in the printed board housing body.
Figure 3:
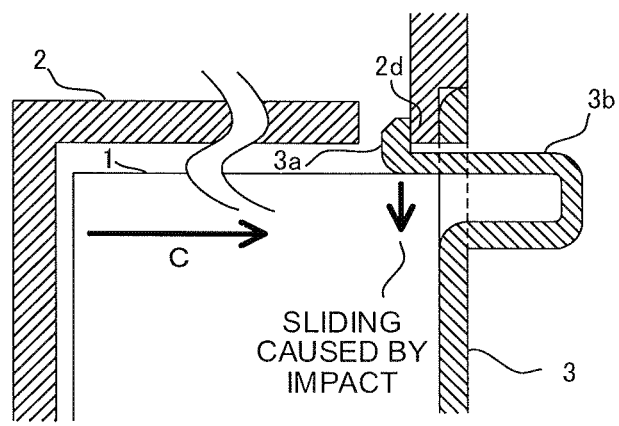
FIG. 3 is a diagram for explaining a problem with a structure for fixing a printed board according to a prior art technique.

Embodiments of the present invention will be described below with reference to the drawings. Configurations which are the same as or similar to those of the prior art techniques will be described with use of the same reference numerals.

In the present invention, a recessed part or a protruding part is provided at a tip of each of hooks provided on a front face panel, and a protruding part or a recessed part is provided on each of engagement parts of a printed board housing body so as to correspond to and be fitted into the recessed part or protruding part of the hook. Thus, the tip of the hook is configured to be brought into rotational engagement with the engagement part of the printed board housing body so that the hook is not disengaged from the engagement part by sliding vertically on the engagement part. With this configuration, the hook cannot be easily disengaged from the engagement part of the printed board housing body normally, whereas pinching a knob provided to the hook at a rear portion thereof in maintenance causes a turn of the tip of the hook, thereby allowing an engagement of the hook with the engagement part of the printed board housing body to be released and fitting of the protruding part into the recessed part to be released, with the result that the printed board can be easily removed.

First, a structure for fixing a printed board according to a first embodiment of the present invention will be described with use of FIG. 4.

Figure 4:
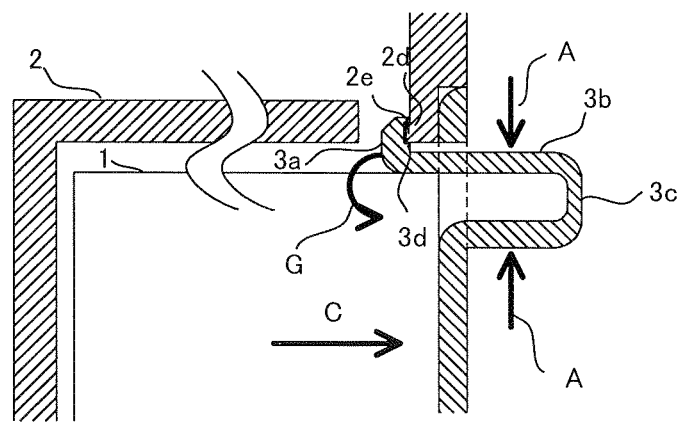
FIG. 4 is a schematic diagram of a structure for fixing a printed board according to a first embodiment of the present invention.

As illustrated in FIG. 4, a front face panel 3 of the embodiment includes hooks 3a and knobs 3b that are formed in shapes into which portions of a member of the front face panel 3 have been bent.

When the front face panel 3 is attached to the printed board housing body 2, the hooks 3a is used to fix the front face panel 3 to a printed board housing body 2 by engaging with engagement parts 2d of the printed board housing body 2. A recessed part 3d is provided to each of the hook 3a at a tip thereof, whereas a protruding part 2e is provided on each of the engagement parts 2d of the printed board housing body 2. Thus, the hook 3a and the engagement part 2d are so configured that when they are engaged with each other, the protruding part 2e is fitted into the recessed part 3d.

The knobs 3b on the front face panel 3 are used for releasing the engagement of the hooks 3a on the front face panel 3 with the engagement parts 2d of the printed board housing body 2. A center part 3c located at general center of each knob 3b is formed having a thickness smaller than thicknesses of the other parts so as to have a low bending elastic modulus.

In the structure illustrated in FIG. 4, as the protruding part 2e on the engagement part 2d of the printed board housing body 2 is fitted into the recessed part 3d at the tip of the hook 3a, the hook 3a will not slide on the engagement part 2d even though the hook 3a receives an impact exerted in a direction (see arrow C) of removal of the printed board, thereby not allowing the hooks 3a to easily come off the engagement parts 2d. In maintenance, pinching the knob 3b provided to the hook 3a at a rear portion thereof causes elastic deformation of the center part 3c of the knob 3b and a turn of the tip of the hook 3a in a direction of an arrow G in the drawing (direction that leads to release of the engagement between the hook 3a and the engagement part 2d and fitting between the recessed part 3d and the protruding part 2e) releases the engagement and the fitting, and consequently allows the front face panel 3 and the printed board 1 to be easily removed from the printed board housing body 2.

In the embodiment illustrated in FIG. 4, the hook 3a, the knob 3b and the center part 3c are formed by bending a portion of the member constituting the front face panel 3, but there is no limitation thereto and the hook 3a, the knob 3b and the center part 3c may be formed as separate members. In this configuration, a member having a bending elastic modulus lower than the member of the knob 3b may be used as the member of the center part 3c.

A modification of the structure for fixing the printed board according to the first embodiment of the present invention will be described with use of FIG. 5.

Figure 5:
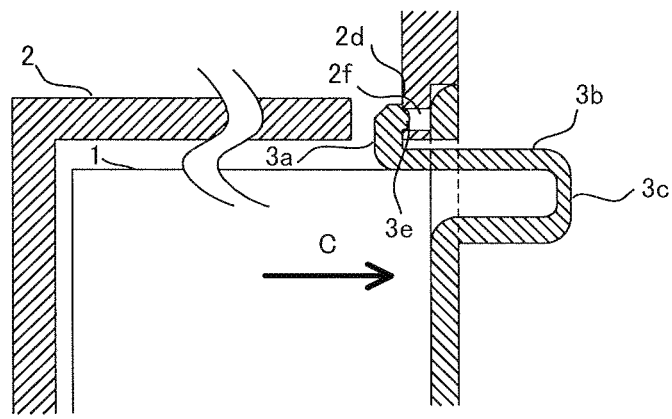
FIG. 5 is a diagram illustrating a modification of the structure for fixing the printed board according to the first embodiment of the present invention.

In the structure for fixing the printed board illustrated in FIG. 5, a protruding part 3e is provided on each of the hooks 3a which the front face panel 3 has, whereas a recessed part 2f is provided on each of the engagement parts 2d of the printed board housing body 2, contrary to the structure for fixing the printed board illustrated in FIG. 4. In the structure, the protruding part 3e of the hook 3a is fitted into the recessed part 2f of the engagement part 2d when the printed board 1 is housed in the printed board housing body 2 so that the hook 3a on the front face panel 3 engages with the engagement part 2d of the printed board housing body 2. The structure illustrated in FIG. 5 attains effects similar to those of the structure for fixing the printed board illustrated in FIG. 4. The recessed part 2f of the engagement part 2d of the printed board housing body 2 may be formed as a hole as illustrated in FIG. 5 or may be formed by embossing or the like.

Next, a structure for fixing a printed board according to a second embodiment of the present invention will be described with use of FIG. 6.

In this embodiment, as with the first embodiment described above (FIGS. 4 and 5), a recessed part (or a protruding part) is provided on each of the hooks 3a at the tip thereof, whereas a protruding part (or a recessed part) is provided on each of the engagement parts 2d of the printed board housing body 2 so that the hook 3a cannot be easily disengaged from the engagement part 2d of the printed board housing body due to impact on the printed board housing body 2 or the like.

In the embodiment, the knobs 3b on the front face panel 3 are each formed in shape of a letter "V" by bending work at a bending fulcrum D thereof so that each of the V-shaped knobs 3b has a portion that extends from the bending fulcrum D to the hook 3a at an angle with respect to the direction perpendicular to the panel surface of the front face panel.

Figure 6:
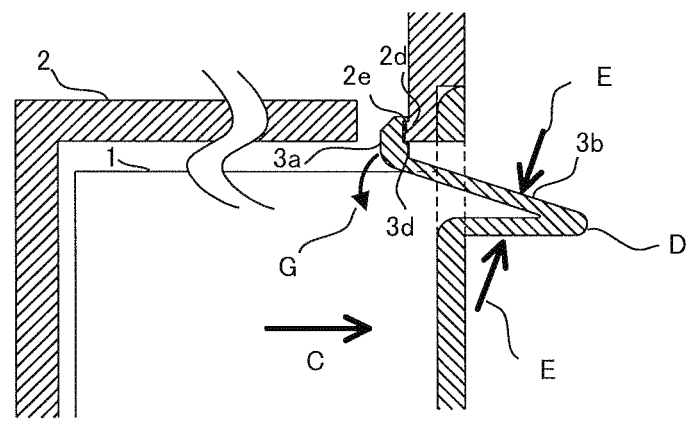
FIG. 6 is a schematic diagram of a structure for fixing a printed board according to a second embodiment of the present invention.

In the structure illustrated in FIG. 6, as with the first embodiment (FIGS. 4 and 5), as the protruding part 2e on the engagement part 2d of the printed board housing body 2 is fitted into the recessed part 3d at the tip of the hook 3a of the front face panel 3, the hook 3a will not slide on the engagement part 2d even though the hook 3a receives an impact exerted in a direction of removal of the printed board, thereby not allowing the hooks 3a to easily come off the engagement parts 2d. In maintenance, pinching the knob 3b provided to the hook 3a at a rear portion thereof in the direction illustrated by arrows E in FIG. 6 (in the direction somewhat tilted relative to the vertical direction) causes elastic deformation of a part around the bending fulcrum D in the knob 3b so that the hook 3a turns around the bending fulcrum D in a direction of an arrow G in the drawing, which leads to release of the engagement between the hook 3a and the engagement part 2d and fitting between the recessed part 3d and the protruding part 2e, as a result, the front face panel 3 and the printed board 1 can easily be removed from the printed board housing body 2.

In the embodiments of the electronic device described above, resistance to impact on the printed board housing body is improved by configurations provided in the front face panel 3 and the printed board housing body 2. Further, an electronic device unit will be described that is aimed at further improvement in the resistance to impact on the printed board housing body by provision of impact buffering hooks on top and bottom faces or a rear face of the printed board housing body, as an additional and auxiliary structure, wherein the impact buffering hooks are configured to engage with recessed parts or protruding parts provided on a printed board to further improve resistance to impact on the printed board housing body.

So, a structure for fixing the printed board according to a third embodiment of the present invention will be described with use of FIG. 7.

In this embodiment, impact buffering hooks 2g extending in a direction toward inside of the printed board housing body 2 are provided on the rear face of the printed board housing body 2 so that the impact buffering hooks 2g are engaged with the recessed parts 1b or the protruding parts (not illustrated) provided on the printed board 1. Such a structure improves the resistance to impact on the printed board housing body, as compared with a structure that resists impact on the printed board housing body 2 only by the hooks 3a and the engagement parts 2d, because forces that arise from impact on the printed board housing body 2 in the direction (direction of an arrow C in FIG. 7) of removal of the printed board in transportation are distributed between the hooks 3a and the impact buffering hooks 2g. An arrow F illustrated in FIG. 7 represents a motion of the impact buffering hook 2g.

Figure 8:
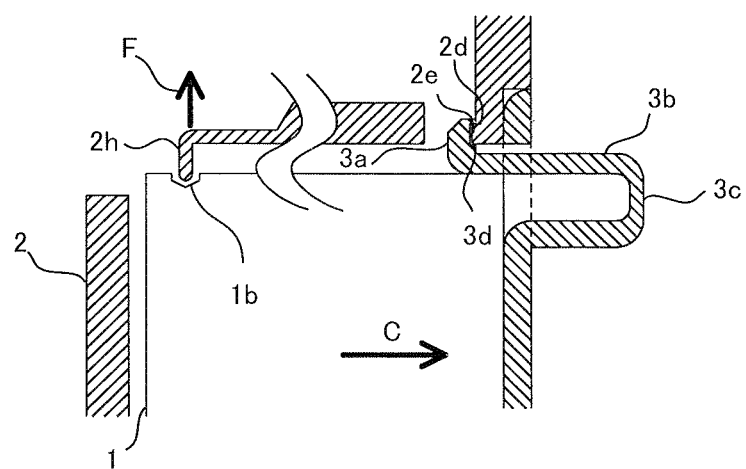
FIG. 8 is a schematic diagram of a structure for fixing a printed board according to a fourth embodiment of the present invention.

Next, a structure for fixing a printed board according to a fourth embodiment of the present invention will be described with use of FIG. 8.

Figure 7:
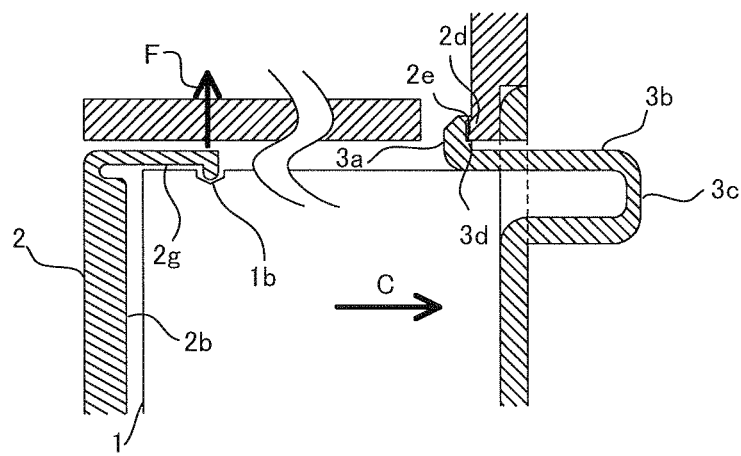
FIG. 7 is a schematic diagram of a structure for fixing a printed board according to a third embodiment of the present invention.

In the structure for fixing the printed board according to the embodiment, an impact buffering hook 2h is provided on the printed board housing body 2 at the top face thereof, and thus effects similar to those of the structure for fixing the printed board illustrated in FIG. 7 can be attained. An arrow F illustrated in FIG. 8 represents a motion of the impact buffering hook 2h.

A modification of the structure for fixing the printed board according to the fourth embodiment of the present invention will be described with use of FIG. 9.

Figure 9:
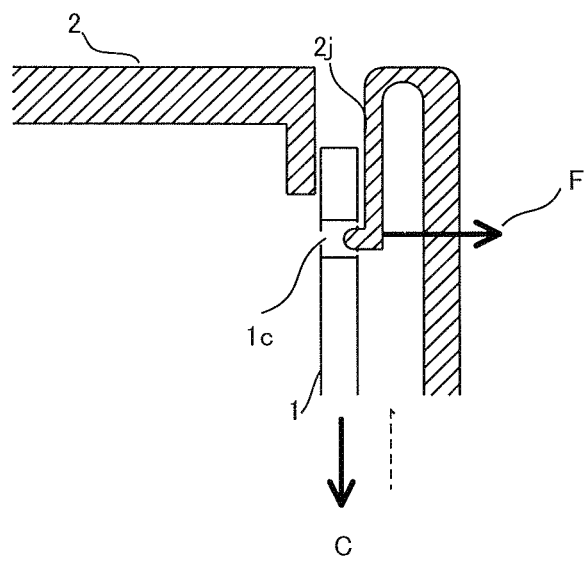
FIG. 9 is a diagram illustrating a modification of the structure for fixing the printed board according to the fourth embodiment of the present invention.

FIG. 9 is a sectional view (section taken along line B-B in FIG. 1) of the printed board housing body 2 in which the printed board 1 is housed. By being moved in directions perpendicular to the drawing sheet of FIG. 9, the printed board 1 is housed in, or removed from, the printed board housing body 2.

In the structure for fixing the printed board according to the embodiment, an impact buffering hook 2j extending from the rear face to inside of the printed board housing body 2 is provided on the printed board housing body 2, whereas a hook receiving part 1c such as a hole is provided on the printed board 1. When the printed board 1 is housed in the printed board housing body 2, a tip of the impact buffering hook 2j on the printed board housing body 2 is fitted into the hook receiving part 1c on the printed board 1 with the help of resilience. Such a configuration can attain effects similar to those of the structures for fixing the printed board illustrated in FIGS. 7 and 8. An arrow F illustrated in FIG. 9 represents a motion of the impact buffering hook 2j.

The invention claimed is:

1. A structure for fixing a printed board in an electronic device unit, wherein
   the electronic device unit includes:
      a printed board housing body;
      a printed board; and
      a front face panel to which the printed board is fixed,
   the front face panel includes:
      hooks on which first recessed parts or first protruding parts are provided at the tip of each of the hooks; and
      knobs for disengaging the hooks,
   wherein the printed board housing body includes engagement parts that engage with the hooks when the front face panel to which the printed board is fixed is attached thereto, each of the engagement parts being provided with a second protruding part to be fitted into the first recessed part or a second recessed part into which the first protruding part is fitted, wherein
   the printed board housing body and the front face panel are configured so that pinching the knobs for removing the front face panel from the printed board housing body directly moves only the hooks and a top part of the knob, thereby causing the hooks to turn in a direction such that engagement between the hooks and the engagement parts and fitting between the first recessed parts and the second protruding part or between the first protruding parts and the second recessed parts are released.

2. The structure for fixing the printed board in the electronic device unit, according to claim 1, wherein the knobs each include a center part that is located at general center thereof and that is configured so as to have a bending elastic modulus lower than the other parts of the knob have.

3. The structure for fixing the printed board in the electronic device unit, according to claim 1, wherein each of the knobs is formed V-shaped by bending work at a bending fulcrum located at general center of the knob so that each of the V-shaped knobs has a portion that extends from the bending fulcrum to the hook at an angle with respect to the direction perpendicular to a panel surface of the front face panel.

4. The structure for fixing the printed board in the electronic device unit, according to claim 1, wherein impact buffering hooks are provided on top and bottom faces or a rear face of the printed board housing body, and third recessed parts or third protruding parts are provided on the printed board so that the impact buffering hooks are engaged with the third recessed parts or the third protruding parts when the printed board is housed in the printed board housing body.

5. A structure for fixing a printed board in an electronic device unit, wherein
the electronic device unit includes:
   a printed board housing body;
   a printed board; and
   a front face panel to which the printed board is fixed,
the front face panel includes:
   hooks on which first recessed parts or first protruding parts are provided at the tip of each of the hooks; and
   knobs for disengaging the hooks,
wherein the printed board housing body includes engagement parts that engage with the hooks when the front face panel to which the printed board is fixed is attached thereto, each of the engagement parts being provided with a second protruding part to be fitted into the first recessed part or a second recessed part into which the first protruding part is fitted, wherein
the printed board housing body and the front face panel are configured so that pinching the knobs for removing the front face panel from the printed board housing body causes the hooks to turn in a direction such that engagement between the hooks and the engagement parts and fitting between the first recessed parts and the second protruding part or between the first protruding parts and the second recessed parts are released, and
wherein an impact buffering hook is provided on a rear face of the printed board housing body and a hook receiving part is provided on the printed board so that the impact buffering hook fits with the hook receiving part when the printed board is housed in the printed board housing body.

6. The structure for fixing the printed board in the electronic device unit, according to claim 2, wherein impact buffering hooks are provided on top and bottom faces or a rear face of the printed board housing body, and third recessed parts or third protruding parts are provided on the printed board so that the impact buffering hooks are engaged with the third recessed parts or the third protruding parts when the printed board is housed in the printed board housing body.

7. The structure for fixing the printed board in the electronic device unit, according to claim 3, wherein impact buffering hooks are provided on top and bottom faces or a rear face of the printed board housing body, and third recessed parts or third protruding parts are provided on the printed board so that the impact buffering hooks are engaged with the third recessed parts or the third protruding parts when the printed board is housed in the printed board housing body.

8. A structure for fixing a printed board in an electronic device unit, wherein
the electronic device unit includes:
   a printed board housing body;
   a printed board; and
   a front face panel to which the printed board is fixed,
the front face panel includes:
   hooks on which first recessed parts or first protruding parts are provided at the tip of each of the hooks; and
   knobs for disengaging the hooks,
wherein the printed board housing body includes engagement parts that engage with the hooks when the front face panel to which the printed board is fixed is attached thereto, each of the engagement parts being provided with a second protruding part to be fitted into the first recessed part or a second recessed part into which the first protruding part is fitted, wherein
the printed board housing body and the front face panel are configured so that pinching the knobs for removing the front face panel from the printed board housing body causes the hooks to turn in a direction such that engagement between the hooks and the engagement parts and fitting between the first recessed parts and the second protruding part or between the first protruding parts and the second recessed parts are released,
wherein the knobs each include a center part that is located at general center thereof and that is configured so as to have a bending elastic modulus lower than the other parts of the knob have, and
wherein an impact buffering hook is provided on a rear face of the printed board housing body and a hook receiving part is provided on the printed board so that the impact buffering hook fits with the hook receiving part when the printed board is housed in the printed board housing body.

9. A structure for fixing a printed board in an electronic device unit, wherein
the electronic device unit includes:
   a printed board housing body;
   a printed board; and
   a front face panel to which the printed board is fixed,
the front face panel includes:
   hooks on which first recessed parts or first protruding parts are provided at the tip of each of the hooks; and
   knobs for disengaging the hooks,
wherein the printed board housing body includes engagement parts that engage with the hooks when the front face panel to which the printed board is fixed is attached thereto, each of the engagement parts being provided with a second protruding part to be fitted into the first recessed part or a second recessed part into which the first protruding part is fitted, wherein
the printed board housing body and the front face panel are configured so that pinching the knobs for removing the front face panel from the printed board housing body causes the hooks to turn in a direction such that engagement between the hooks and the engagement parts and fitting between the first recessed parts and the second protruding part or between the first protruding parts and the second recessed parts are released,
wherein each of the knobs is formed V-shaped by bending work at a bending fulcrum located at general center of the knob so that each of the V-shaped knobs has a portion that extends from the bending fulcrum to the hook at an angle with respect to the direction perpendicular to a panel surface of the front face panel, and wherein an impact buffering hook is provided on a rear face of the printed board housing body and a hook receiving part is provided on the printed board so that the impact buffering hook fits with the hook receiving part when the printed board is housed in the printed board housing body.

* * * * *